(12) United States Patent
Kim et al.

(10) Patent No.: US 10,309,009 B2
(45) Date of Patent: Jun. 4, 2019

(54) CARBON THIN-FILM DEVICE AND METHOD OF MANUFACTURING THE SAME

(71) Applicant: Industry-Academic Cooperation Foundation, Yonsei University, Seoul (KR)

(72) Inventors: Hyungjun Kim, Seoul (KR); Taejin Choi, Goyang-si (KR); Jeong-Gyu Song, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 231 days.

(21) Appl. No.: 15/089,702

(22) Filed: Apr. 4, 2016

(65) Prior Publication Data
US 2016/0289825 A1    Oct. 6, 2016

(30) Foreign Application Priority Data

Apr. 6, 2015    (KR) ......................... 10-2015-0048290

(51) Int. Cl.
| | |
|---|---|
| C23C 16/44 | (2006.01) |
| C23C 16/02 | (2006.01) |
| C23C 16/26 | (2006.01) |
| C23C 16/455 | (2006.01) |

(52) U.S. Cl.
CPC ............. *C23C 16/02* (2013.01); *C23C 16/26* (2013.01); *C23C 16/45525* (2013.01)

(58) Field of Classification Search
CPC .................................................... C23C 16/02
See application file for complete search history.

(56) References Cited

U.S. PATENT DOCUMENTS

| | | | | |
|---|---|---|---|---|
| 6,482,262 | B1* | 11/2002 | Elers ................... | C23C 16/0272 117/84 |
| 2005/0003089 | A1* | 1/2005 | Won ..................... | C23C 16/0281 427/249.1 |
| 2007/0265159 | A1* | 11/2007 | Elam ........................ | B01J 23/40 502/263 |
| 2010/0143710 | A1* | 6/2010 | Dickey ................. | C23C 16/405 428/336 |
| 2013/0337625 | A1* | 12/2013 | Fujiwara ........... | H01L 21/02271 438/381 |
| 2014/0030447 | A1 | 1/2014 | Lee et al. | |

FOREIGN PATENT DOCUMENTS

| | | |
|---|---|---|
| JP | 5569825 B2 | 8/2014 |
| KR | 2006-0054387 A | 5/2006 |
| KR | 2007-0028252 A | 3/2007 |
| KR | 2008-0032599 A | 4/2008 |
| KR | 20130005150 A | 1/2013 |
| KR | 2014-0074097 A | 6/2014 |
| WO | WO2014-097280 * | 6/2014 |

OTHER PUBLICATIONS

Kim, KR1020130005150, Jan. 2013, machine translation. (Year: 2013).*

* cited by examiner

*Primary Examiner* — Joseph A Miller, Jr.
(74) *Attorney, Agent, or Firm* — Harness, Dickey & Pierce, P.L.C.

(57) ABSTRACT

Disclosed is a carbon thin-film device and method for manufacturing the same. The method includes forming a functional group on a surface of a substrate and functionalizing the substrate, and depositing a carbon thin film through ALD on the substrate in which the functional group is formed.

6 Claims, 12 Drawing Sheets

CARBON THIN-FILM DEVICE AND METHOD OF MANUFACTURING THE SAME

CROSS-REFERENCE TO RELATED APPLICATIONS

A claim for priority under 35 U.S.C. § 119 is made to Korean Patent Application No. 10-2015-0048290 filed Apr. 6, 2015, in the Korean Intellectual Property Office, the entire contents of which are hereby incorporated by reference.

BACKGROUND

Embodiments of the inventive concept described herein relate to a carbon thin-film device and method of manufacturing the same.

Carbon thin films are highly interesting the technical and industrial applications because of superior electrical and mechanical characteristics. Traditionally, carbon thin films are formed through Chemical Vapor Deposition (CVD) or Physical Vapor Deposition (PVD). CVD requires high temperature and high vacuum to increase a processing cost. CVD or PVD are insufficient to form uniform coverage of carbon thin film on a substrate in a large area. Especially, in a traditional CVD or PVD, a carbon thin film is unevenly formed on a nanostructure with high steps such as silicon nanoholes.

Atomic Layer Deposition (ALD) is proposed to overcome the shortness of CVD and PVD, capable of forming a uniform thin film in a large area and controlling a thickness of a thin film in the unit of atomic layer. However, ALD is insufficient to uniformly form a carbon thin film on a stabilized substrate in a large area.

CVD deposits a material, which is generated by reaction with a reactant and carbon precursors, on a substrate of high temperature, whereas ALD, as a technique of forming carbon precursors on a substrate before reacting with a reactant, is insufficient to adhere the carbon precursors on a stabilized substrate and to deposit a carbon thin film on the substrate.

SUMMARY

Embodiments of the inventive concept provide a carbon thin-film device, and a method for manufacturing the device, capable of uniformly depositing a carbon thin film in a large area through ALD.

Embodiments of the inventive concept also provide a carbon thin-film device, and a method for manufacturing the device, capable of uniformly depositing a carbon thin film on a stabilized substrate, which has weak adsorption to carbon precursors, in a large area when depositing the carbon thin film by ALD.

Embodiments of the inventive concept further provide a carbon thin-film device in which a carbon thin film is uniformly deposited on a three-dimensional structure such as nanowires or on a nanostructure with high steps such as nanoholes.

Directions of the inventive concepts may not be restrictive to the aforementioned technical subjects and even other technical subjects not mentioned may be comprehensible from the following description by those skilled in the art.

A method of manufacturing a carbon thin-film device according to an embodiment of the inventive concept may include forming a functional group on a surface of a substrate to functionalize the substrate, and depositing a carbon thin film through atomic layer deposition on the substrate on which the functional group is formed.

In an embodiment, the functional group may comprise at least one selected from oxygen group, hydroxyl group, and amino group.

In an embodiment, the functionalizing of the substrate may include supplying a solution, which is made by mixing sulfuric acid and hydrogen peroxide water, to the substrate to form a hydroxyl group on the substrate.

In an embodiment, the functionalizing of the substrate may include treating the substrate with oxygen plasma to form an oxygen group on the substrate.

In an embodiment, the functionalizing of the substrate may comprise forming an adsorption layer, which contains the functional group, on the substrate.

In an embodiment, the adsorption layer may be formed of a single atomic layer or a single molecular layer.

In an embodiment, the functionalizing of the substrate may include forming the functional group on the substrate to allow oxygen or nitrogen atoms of the adsorption layer to be covalent-bonded with atoms of the substrate.

In an embodiment, the depositing of the carbon thin film on the substrate may include forming the carbon thin film on the substrate to allow carbon atoms of a basal layer of the carbon thin film to be covalent-bonded with oxygen or nitrogen atoms of the adsorption layer.

In an embodiment, the depositing of the carbon thin film on the substrate may include repeating unit cycles in a number of times, wherein the unit cycle may include supplying halocarbon as carbon precursors to the substrate, supplying a purge gas to the substrate to purge the substrate, supplying a reaction gas to the substrate, and supplying a purge gas to the substrate to purge the substrate, wherein a supply time of the halocarbon at the first unit cycle is longer than a supply time of the halocarbon at the unit cycle after the second unit cycle.

In an embodiment, the reaction gas may have larger bonding energy to halogen atoms of the halocarbon than to carbon atoms of the halocarbon.

In an embodiment, the halocarbon may be carbon tetrabromide ($CBr_4$), wherein the reaction gas may be hydrogen gas or hydrogen plasma.

In an embodiment, the carbon tetrabromide ($CBr_4$) may be supplied under partial pressure 0.01 to 0.02 torr for 2 to 8 seconds.

In an embodiment, the method may further include pre-supplying halocarbon to the substrate, on which the functional group is formed, between the functionalizing of the substrate and the depositing of the carbon thin film on the substrate.

In an embodiment, the halocarbon may be carbon tetrabromide ($CBr_4$).

In an embodiment, the pre-supplying of the halocarbon may include supplying the halocarbon to the substrate, on which the functional group is formed, for 30 seconds to 5 minutes.

In an embodiment, the carbon thin film may be formed at deposition temperature of 200 to 450° C.

A carbon thin-film device according to an embodiment of the inventive concept may include a substrate, an adsorption layer on the substrate, and a carbon layer on the adsorption layer, wherein the adsorption layer may comprise a functional group comprising at least one selected from oxygen and nitrogen atoms.

In an embodiment, the adsorption layer may be formed of a single layer with oxygen or nitrogen atoms.

In an embodiment, the oxygen or nitrogen atoms of the adsorption layer may be covalent-bonded with carbon atoms of a basal layer of the carbon layer.

In an embodiment, the oxygen or nitrogen atoms of the adsorption layer may be covalent-bonded with atoms of a surface layer of the substrate.

In an embodiment, the substrate may include at least one or more nanoholes and the carbon layer may be formed on a substrate having the nanohole.

In an embodiment, a thickness of the adsorption layer may be 0.05 to 0.3 nm.

A carbon nanowire according to another embodiment of the inventive concept may include a nanowire, a carbon layer wrapping the nanowire, and an adsorption layer between the nanowire and the carbon layer, wherein the adsorption layer may include a functional group, the functional group comprising at least one selected from oxygen and nitrogen.

In an embodiment, the adsorption layer may be formed of a single layer with oxygen or nitrogen.

In an embodiment, a thickness of the adsorption layer may be 0.05 to 0.3 nm.

In an embodiment, the oxygen or nitrogen atoms of the adsorption layer may be covalent-bonded with carbon atoms of a basal layer of the carbon layer and with atoms of a surface layer of the substrate.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
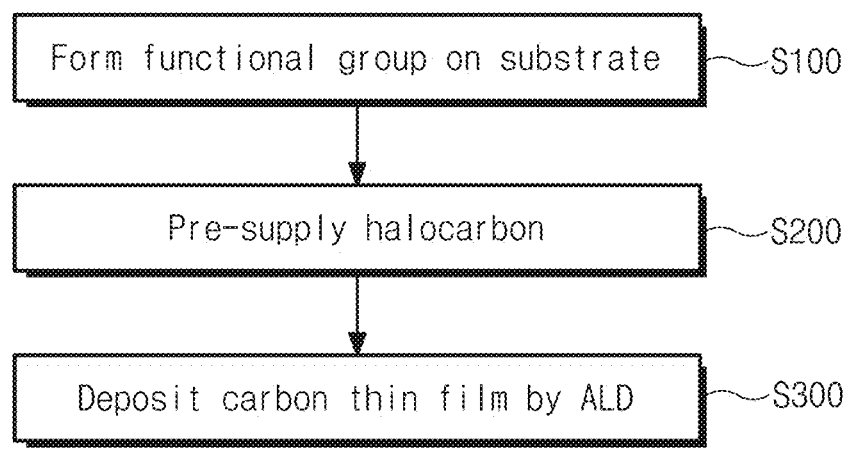
FIG. 1 is a flow chart showing a method for manufacturing a carbon thin-film device according to embodiments of the inventive concept.

Other aspects, advantages, and salient features of the inventive concept will become apparent to those skilled in the art from the following detailed embodiments. Various embodiments described herein, however, may not be intentionally confined in specific embodiments, but should be construed as including diverse modifications, equivalents, and/or alternatives. Various embodiments are merely provided to help those skilled in the art to clearly understand the technical scope of the inventive concept and the inventive concept may be only defined by the scope of the annexed claims.

Unless otherwise defined herein, all the terms used herein (including technical or scientific terms) may have the same meaning that is generally acceptable by universal technology in the related art of the inventive concept. It will be further understood that terms, which are defined in a dictionary and commonly used, may also be interpreted as is customary in the relevantly related art and/or as is same in the description of the present application. Even in the case of terminological expression with insufficient clarification, such terms may not be conceptualized or overly interpreted in formality. Therefore, the terms used in this specification are just used to describe various embodiments of the inventive concept and may not be intended to limit the scope of the inventive concept.

In the description, the terms of a singular form may also include plural forms unless otherwise specified. The terms 'include' and/or its diverse inflections or conjugations, for example, 'inclusion', 'including', 'includes', or 'included', as used herein, may be construed such that any one of a constitution, a component, an element, a step, an operation, and/or a device does not exclude presence or addition of one or more different constitutions, components, elements, steps, operations, and/or devices. Additionally, the term 'comprise' and 'have' should be also interpreted as such.

A method for manufacturing a carbon thin-film device according to an embodiment of the inventive concept may form a functional group, which is provided to adsorb carbon precursors on a substrate, on the surface of the substrate. The method may provide a carbon thin-film device in uniformity of deposition with a carbon thin film by ALD.

In an embodiment, a functional group capable of adsorbing carbon precursors on a substrate may be used with oxygen function group, hydroxyl group, or amino group.

A method for manufacturing a carbon thin-film device may allow a carbon thin film to be efficiently deposited on a substrate by pre-supplying halocarbon to the substrate before depositing the carbon thin film through ALD, or by lengthening a supply time of halocarbon in a first processing cycle of ALD processes for the carbon thin film.

According to embodiments, it may be permissible to uniformly deposit a carbon thin film on a substrate in a large area, unlimited to a kind of the substrate, through ALD without deposition of other metal layer on the substrate which is stabilized as like Si, $SiO_2$, SiN, or $Al_2O_3$. Additionally, it may be allowable to a carbon thin film to be deposited under low temperature of a chamber, which is ranged in 200° C. to 450° C., during carbon thon-film deposition by ALD.

Additionally, according to embodiments, it may be allowable to provide a carbon thin-film device, or a carbon nanowire, having a carbon thin film which is uniformly deposited on a three-dimensional structure such as nanowire or nanostructure with high steps like nanoholes.

Hereafter embodiments of the inventive concept will be described in conjunction with the accompanied figures.

FIG. 1 is a flow chart showing a method for manufacturing a carbon thin-film device according to embodiments of the inventive concept.

Referring to FIG. 1, the method for manufacturing a carbon thin-film device according to an embodiment of the inventive concept may include a step of forming a functional group on the surface of a substrate to functionalize the substrate (S100), a step of pre-supplying halocarbon (S200), and a step of depositing a carbon thin film through ALD (S300).

At the step S100, the functional group is preliminarily formed on the substrate before depositing the carbon thin film through ALD. The functional group is formed on the surface of the substrate to allow carbon precursors for the carbon thin film to be easily adsorbed to the substrate. In an embodiment, the functional group may include at least one of oxygen group, hydroxyl group, and amino group.

Figure 2A:
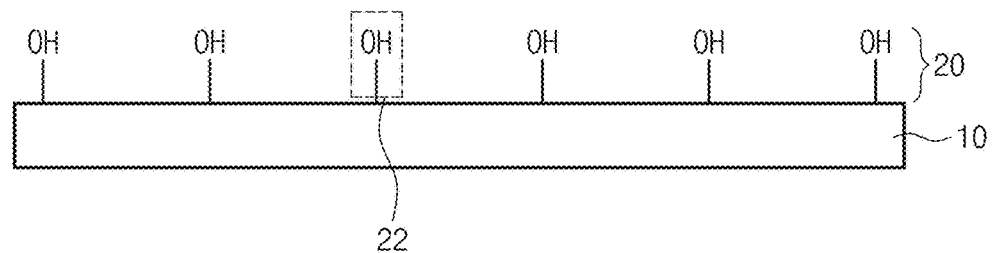
FIG. 2A shows the step S100 of FIG. 1, illustrating an adsorption layer 20 to which a functional group 22 of hydroxyl group is adsorbed on the surface of a substrate 10.

FIG. 2A shows the step S100 of FIG. 1, illustrating an adsorption layer 20 to which a functional group 22 of hydroxyl group is adsorbed on the surface of a substrate 10.

Referring to FIGS. 1 and 2A, a method for manufacturing a carbon thin-film device according to an embodiment of the inventive concept may form an adsorption site, e.g., a hydroxyl group (—OH), as the functional group 22 on a silicon oxide ($SiO_2$) substrate. Thereby, it may be possible to deposit a carbon thin film through ALD even on the substrate 10 which has weak molecular adsorption, e.g., a stabilized semiconductor substrate, such as Si. $SiO_2$, SiN, or $Al_2O_3$ substrate.

The hydroxyl group may be formed using a solution which is made by mixing sulfuric acid and hydrogen peroxide water. For example, a hydroxyl group may be formed on a substrate by maintaining a solution, which is made in the ratio of sulfuric acid ($H_2SO_4$, 35%) and hydrogen peroxide water ($H_2O_2$, 35%), under 60° C. to 80° C., by precipitating the substrate in the solution for 10 to 60 minutes, by drawing out the substrate from the solution and washing the substrate by deionized water, and then by blowing and drying the substrate with nitrogen gas. Accordingly, the functional group 22 of the adsorption layer 20 may be adsorbed to atoms of a surface layer of the substrate 10 in the state of covalent bond.

Figure 2B:
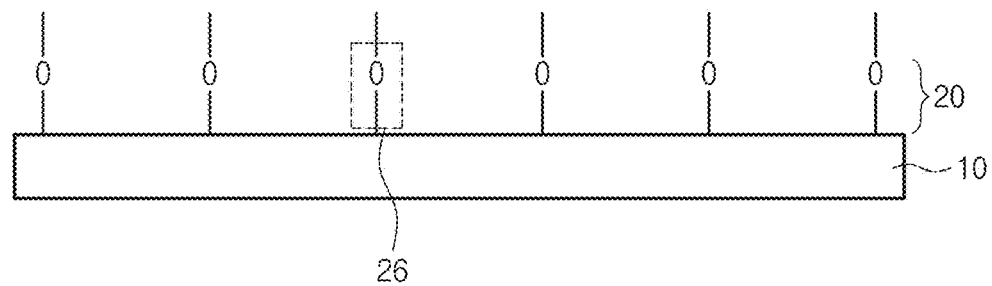
FIG. 2B shows the step S100 of FIG. 1, schematically illustrating the adsorption layer 20 to which an oxygen group 26 is adsorbed on the surface of the substrate 10.

FIG. 2B shows the step S100 of FIG. 1, schematically illustrating the adsorption layer 20 to which an oxygen group 26 is adsorbed on the surface of the substrate 10. As an embodiment, the oxygen group 26 may be formed through oxygen plasma treatment in an ALD chamber. For example, the oxygen group 26 may be formed in the substrate 10 by after entering a substrate into an ALD chamber and then by treating the substrate with oxygen gas ($O_2$) of 10 to 50 sccm for 2 minutes or more time under 80 to 120 W.

Figure 3:
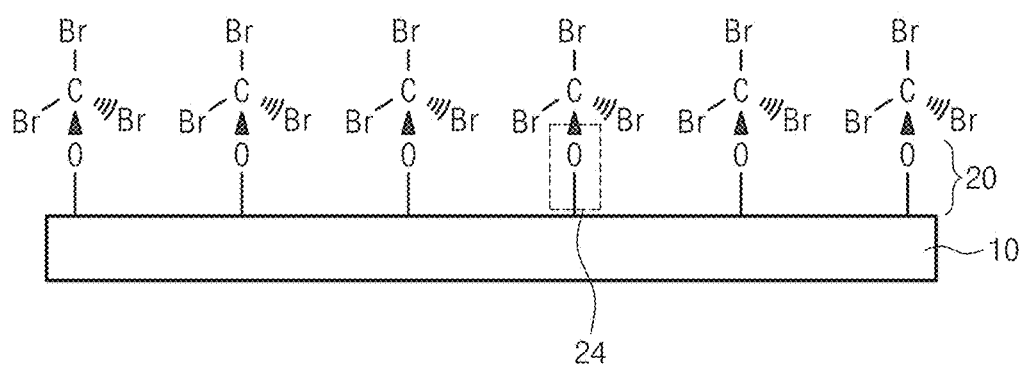
FIG. 3 shows the step S200 of FIG. 1, schematically illustrating a state of pre-supplying halocarbon to the surface of a substrate.

FIG. 3 shows the step S200 of FIG. 1, schematically illustrating a state of pre-supplying halocarbon to the surface of a substrate. Referring to FIGS. 1 and 3, if halocarbon is pre-supplied to the surface of the substrate, carbon atoms of the halocarbon may be covalent-bonded with a functional group 24.

The step S200 of pre-supplying the halocarbon may supply the halocarbon to the substrate for 30 seconds to 5 minutes before the step of depositing a carbon thin film through ALD after forming the functional group on the substrate. A carbon thin film is more easily deposited on the substrate than the case without the pre-supplying of halocarbon at least for 30 minutes or more time. In the case of supplying halocarbon for more than 5 minutes, it may cause unnecessary dissipation of processing time. Additionally, the halocarbon may be carbon tetrabromide ($CBr_4$).

As an embodiment, the pre-supplying the halocarbon may be replaced with a step of supplying carbon precursors of a first processing cycle for a time longer than a time of supplying carbon precursors after a second processing cycle in the step of depositing a carbon thin film through ALD.

Figure 4:
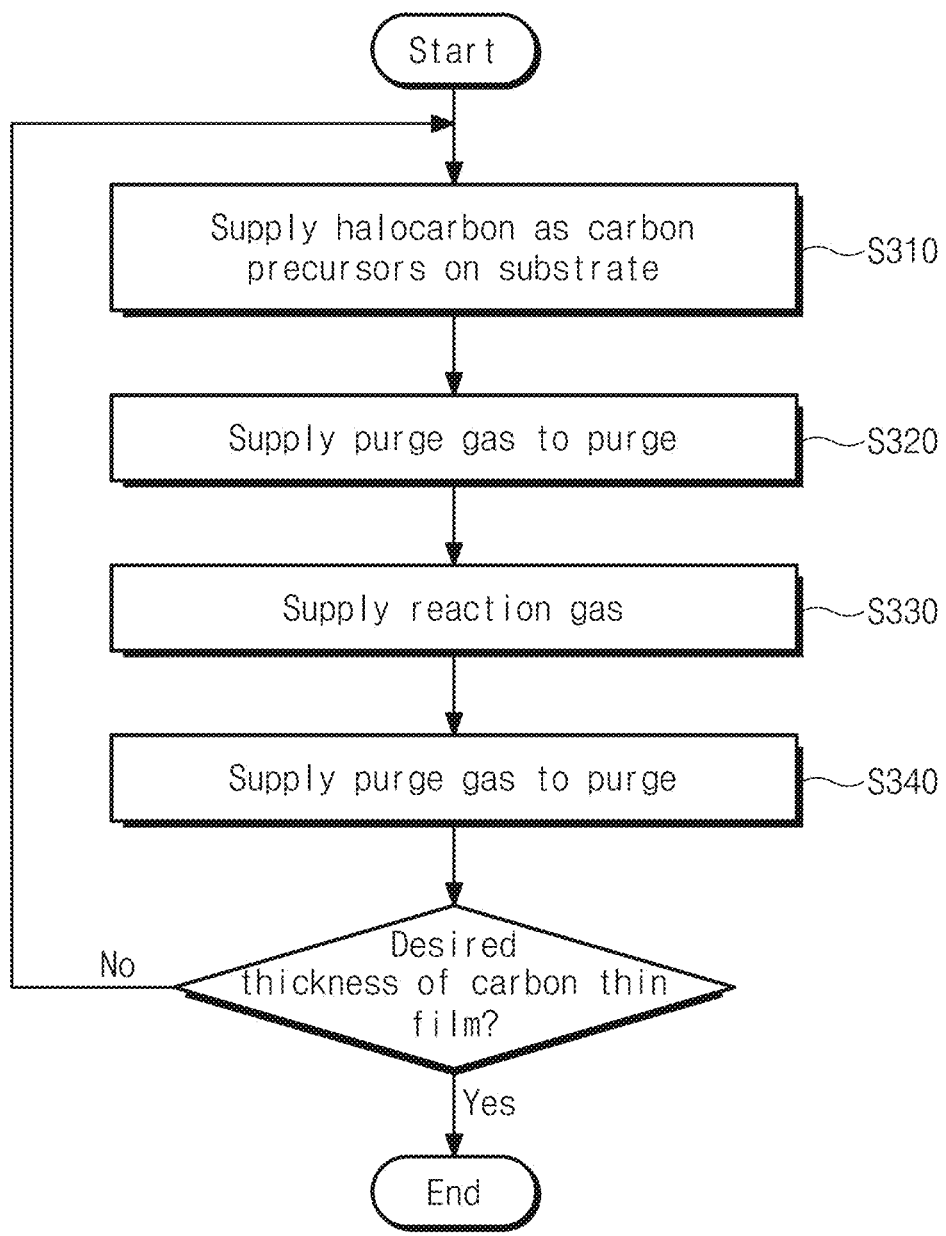
FIG. 4 shows the step S300 of FIG. 1.

FIG. 4 shows the step S300 of FIG. 1. Referring to FIGS. 1 and 4, a carbon thin film may be formed on a substrate by the step S300 of depositing a carbon thin film through ALD. The step S300 may be performed by repeating a processing cycle, as many as a number of times, including a step S310 of supplying halocarbon as carbon precursors to the substrate, a step S320 of supplying a purge gas to the substrate to purge the substrate, a step S330 of supplying a reaction gas, and a step S340 of supplying a purge gas to purge the substrate until the carbon thin film is formed in a thickness. According to this embodiment, since a carbon thin film id deposited through ALD and a functional group of a substrate induces adsorption of carbon precursors, it may be permissible to deposit the carbon thin film at low temperature of 200° C. to 450° C.

As an embodiment, the halocarbon may be carbon tetrabromide ($CBr_4$). With carbon tetrabromide ($CBr_4$), a bond between carbon and bromine (Br) may be broken due to hydrogen radicals which are supplied by a reaction gas, the bromine is bonded with the hydrogen radicals to be hydrogen bromide (HBr), and a carbon thin film may be then deposited by carbon which remains. As a bond between bromine (Br) and carbon of carbon tetrabromide ($CBr_4$) is weaker than a bond between carbon and chloride (Cl) or between carbon and fluorine (F), hydrogen radicals may more easily break the bond between carbon and bromine (Br) than the bond between carbon and fluorine (F). Accordingly, supplying carbon tetrabromide ($CBr_4$) as carbon precursors may be more advantageous in depositing a carbon thin film at low temperature than supplying carbon tetrachloride ($CCl_4$) or carbon fluoride ($CF_4$) as carbon precursors. Additionally, carbon tetrabromide ($CBr_4$) is solid at room temperature and relatively stable without volatility, whereas carbon tetrachloride ($CCl_4$) is liquid and carbon fluoride ($CF_4$) is gaseous at room temperature.

As an embodiment, at the step 310 of supplying halocarbon as carbon precursors to the substrate, carbon tetrabromide ($CBr_4$) may be supplied to a substrate, in which a functional group is formed, in an ALD chamber for 2 to 8 seconds under partial pressure of 0.01 to 0.02 torr. In the case of setting a supply time of the carbon tetrabromide ($CBr_4$) less than 2 seconds, a carbon thin film may be hardly deposited. In the case of setting a supply time of the carbon tetrabromide ($CBr_4$) more than 8 seconds, a carbon thin film may be rather degraded in growth rate and a processing time may be unnecessarily dissipated (see FIG. 14).

At the purging step S320 of supplying a purge gas, the purge gas may be used with an inert gas. For example, argon gas (Ar) may be injected into the ALD chamber under partial pressure of 0.08 to 0.3 torr.

At the step of supplying a reaction gas, the reaction gas may be a gas which has a larger bonding energy to halogen atoms of halocarbon than that of carbon. As an embodiment, hydrogen plasma may be supplied by treating the reaction gas with plasma in the atmosphere of hydrogen under partial pressure of 0.4 to 1.8 torr.

At the purging step S340 of supplying a purge gas, as like the step S320, argon gas (Ar) may be injected into the ALD chamber under partial pressure of 0.08 to 0.3 torr and then the ALD chamber is purged.

Figure 5:
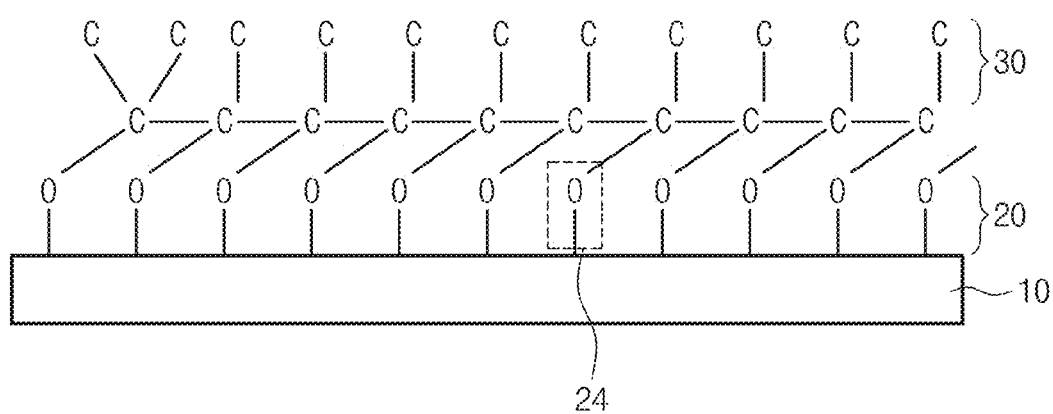
FIG. 5 illustrates a structure of a carbon thin-film device manufactured according to an embodiment of the inventive concept.

FIG. 5 illustrates a structure of a carbon thin-film device manufactured according to an embodiment of the inventive concept.

The carbon thin-film device manufacture by an embodiment of the inventive concept may include a substrate 10, an adsorption layer 20 containing a plurality of oxygen or nitrogen atoms on the substrate 10, and a carbon layer 30 containing a plurality of carbon atoms on the adsorption layer 30.

As an embodiment, as shown in FIG. 5, the carbon thin-film device may be formed of the adsorption layer 20 as a single atomic layer containing a plurality of oxygen atoms on the substrate 10, and at least one or more carbon layers containing a plurality of carbon atoms on the adsorption layer 20.

For example, the adsorption layer 20 may be formed of a single atomic layer containing oxygen or nitrogen atoms. In this case, a thickness of the adsorption layer may be 0.05 nm to 0.3 nm. In the case that the adsorption layer 20 is formed of several atomic layers. The adsorption layer 20 may not even function as an adsorption site for adsorbing carbon precursors to the substrate 10 in order to form a carbon thin film.

In this embodiment, oxygen or nitrogen atoms forming a single atomic layer forming the adsorption layer 20 may be downward covalent-bonded directly with atoms of a surface layer of the substrate 10, and may upward covalent-bonded directly with carbon atoms of a basal layer of the carbon layer 30. Thereby, the carbon layer 30 may be uniformly adsorbed on the substrate by surface.

As an embodiment, the substrate may be a substrate including at least one or more nanoholes. For example, the nanoholes may have a diameter of 1 nm to 100 nm. The nanoholes may have high steps of 5:1 in aspect ratio. By forming an adsorption layer on the nanoholes, it may be allowable to uniformly form the high-stepped nanohole structure through ALD (see FIGS. 12A to 12C).

Additionally, a carbon nanowire according to an embodiment of the inventive concept, as like the carbon thin film, may include an adsorption layer, which contains a plurality of oxygen or nitrogen atoms, on the nanowire structure and may include a carbon thin film which contains a plurality of carbon atoms on the adsorption layer. For example, the nanowire may be a Si, $SiO_2$, SiN, or $Al_2O_5$ nanowire. Additionally, the adsorption layer may be a single atomic layer with a thickness of 0.05 nm to 0.3 nm. Additionally, oxygen or nitrogen atoms of the adsorption layer may be covalent-bonded with atoms of a substrate surface layer and with carbon atoms of a basal layer of the carbon layer.

Hereafter the method for manufacturing a carbon thin-film device according to the inventive concept will be described through embodiments as follows.

Embodiment 1

First, a substrate, in which silicon oxide ($SiO_2$) was formed with 285 nm on a silicon substrate, is put into high-purity acetone, methanol, and deionized water in sequence each for 10 minutes and then particles was removed from the substrate by a vibrator.

After then, to form a functional group on the substrate, sulfuric acid ($H_2SO_4$, 35%) and hydrogen peroxide ($H_2O_2$, 35%) were mixed in the ratio 7:3 to form a solution of 150 ml. The substrate was precipitated in the solution for 1 hour while the solution was maintained at temperature of 60. And then, the substrate was drawn out from the solution, washed by deionized water, blown and dried by nitrogen gas ($N_2$). Thereby, a hydroxyl group was formed on the surface of the substrate.

After moving the substrate, in which the hydroxyl group was formed, to an ALD chamber, carbon tetrabromide ($CBr_4$) was pre-supplied into the ALD chamber under partial pressure of 10 mTorr. The ALD chamber was maintained at temperature of 300° C.

Then, a carbon thin film was deposited in the substrate through ALD. In detail, carbon tetrabromide ($CBr_4$) as carbon precursors was supplied into the ALD chamber under partial pressure of 10 mTorr. After purging the ALD chamber by supplying argon gas (Ar) into the ALD chamber for 9 seconds under partial pressure of 0.3 torr, hydrogen plasma was formed by treatment for 2 seconds with the power of 200 W in the atmosphere of hydrogen gas under partial pressure of 1.8 torr. And argon gas (Ar) was supplied into the ALD chamber for 9 seconds under partial pressure of 0.3 torr for purging. A process, which sequentially performed the steps of supplying carbon precursors, purging, supplying hydrogen, and purging, as one processing cycle was repeated in 250 times to form a carbon thin film. For comparison with the inventive concept, Comparison 1 was prepared by equalizing the process with Embodiment 1 except the step of forming a functional group and by depositing a carbon thin film on a substrate without the functional group through ALD.

To confirm an effect by pre-supplying halocarbon, Comparison 2 was prepared by equalizing the process with Embodiment 1 except the step of pre-supplying carbon tetrabromide and by depositing a carbon thin film on a substrate through ALD.

Figure 6:
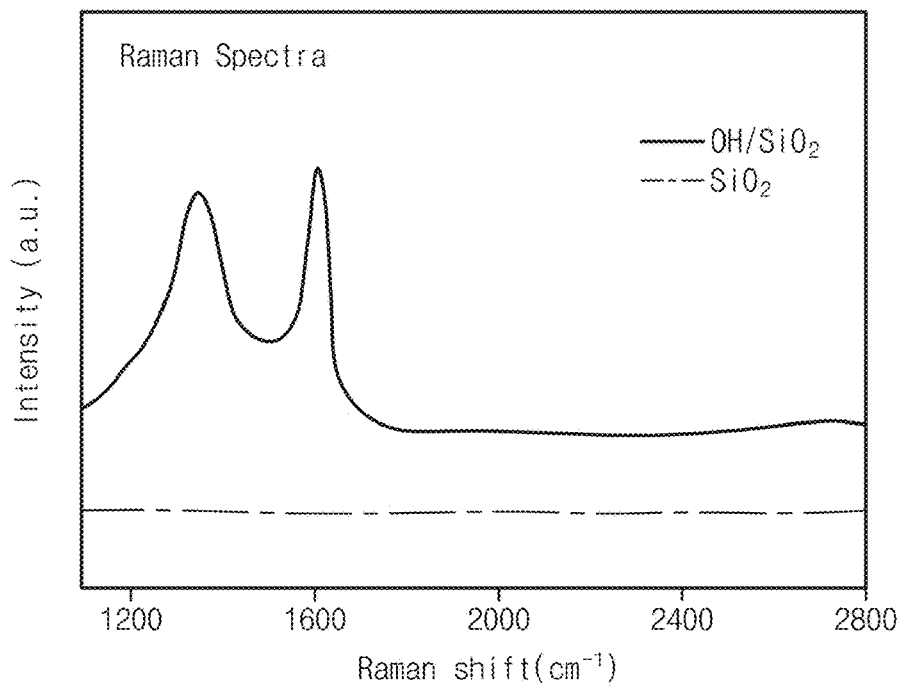
FIG. 6 is a graph showing Raman spectra of carbon thin-film devices manufactured by forming Embodiment 1 and Comparison 1.

FIG. 6 is a graph showing Raman spectra of carbon thin-film devices manufactured by forming Embodiment 1 and Comparison 1. In the Raman spectra, a difference between Raman values corresponding to two peaks indicates a deposition thickness of a carbon thin film. As large as a difference between Raman values corresponding to two peaks, a deposition thickness of a carbon thin film may increase.

Referring to FIG. 6, it can be seen that there is a difference in effect of carbon thin-film deposition between the case of depositing a carbon thin film on a silicon oxide ($SiO_2$)

substrate, in which a hydroxyl group is formed as a functional group, through ALD (Embodiment 1) and the case of depositing a carbon thin film through ALD on a silicon oxide ($SiO_2$) substrate without a functional group (Comparison 1).

As shown in FIG. 6, in the case of depositing a carbon thin film by ALD on a substrate without a functional group ($SiO_2$), it can be seen that there is no peak value representing presence of carbon particles. Thus, it can be seen that a carbon thin film is hardly deposited on a substrate by ALD In the case without a functional group but a carbon thin film is easily deposited on a substrate in the case with a hydroxyl group ($OH/SiO_2$).

Figure 8:
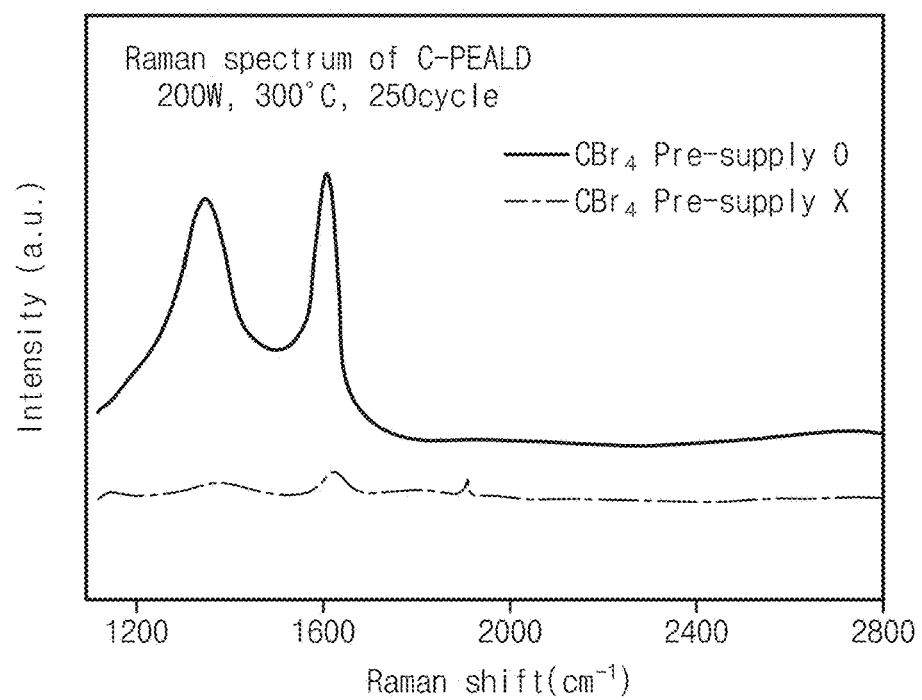
FIG. 8 is graph showing Raman spectra of a carbon thin-film device by the pre-supplying of halocarbon according to an embodiment of the inventive concept.

FIG. 8 is graph showing Raman spectra of a carbon thin-film device by the pre-supplying of halocarbon according to an embodiment of the inventive concept.

Referring to FIG. 8, it can be seen that there is a difference in effect of carbon thin-film deposition between a carbon thin film of Embodiment 1 (Pre-supply 0) and a carbon thin film of Comparison 2 (Pre-supply X) which does not pre-supply halocarbon. As shown in FIG. 8, it can be seen that a carbon thin film of a carbon thin-film device according to Embodiment 1 pre-supplying carbon tetrabromide ($CBr_4$) is more easily deposited than the case of not pre-supplying carbon tetrabromide ($CBr_4$).

Embodiment 2

This embodiment was performed as same as Embodiment 1, but did not form a hydroxyl group as a functional group on a substrate, and formed an oxygen group through oxygen ($O_2$) plasma treatment in an ALD chamber. In detail, after loading a substrate into an ALD chamber, oxygen gas ($O_2$) of 20 sccm was processed for 2 seconds in power of 100 W to form an oxygen group on the substrate.

Figure 7:
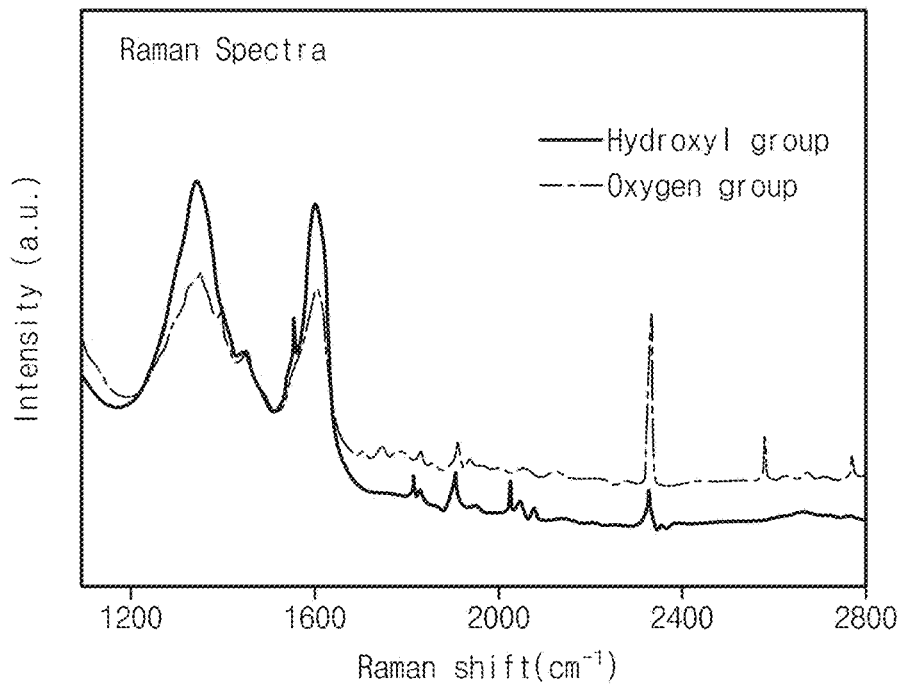
FIG. 7 is a graph showing Raman spectra of a carbon thin-film device forming a functional group according to embodiments of the inventive concept.

FIG. 7 is a graph showing Raman spectra of a carbon thin-film device forming a functional group according to embodiments of the inventive concept. Referring to FIG. 7, as like Embodiment 1, it can be seen that a carbon thin film is well deposited on a substrate of a carbon thin-film device with an oxygen group as a functional group which is formed according to Embodiment 2.

Embodiment 3

This embodiment was performed as same as Embodiment 1 but deposited a carbon thin film while maintaining an ALD chamber at temperature of 400° C.

Figure 9:
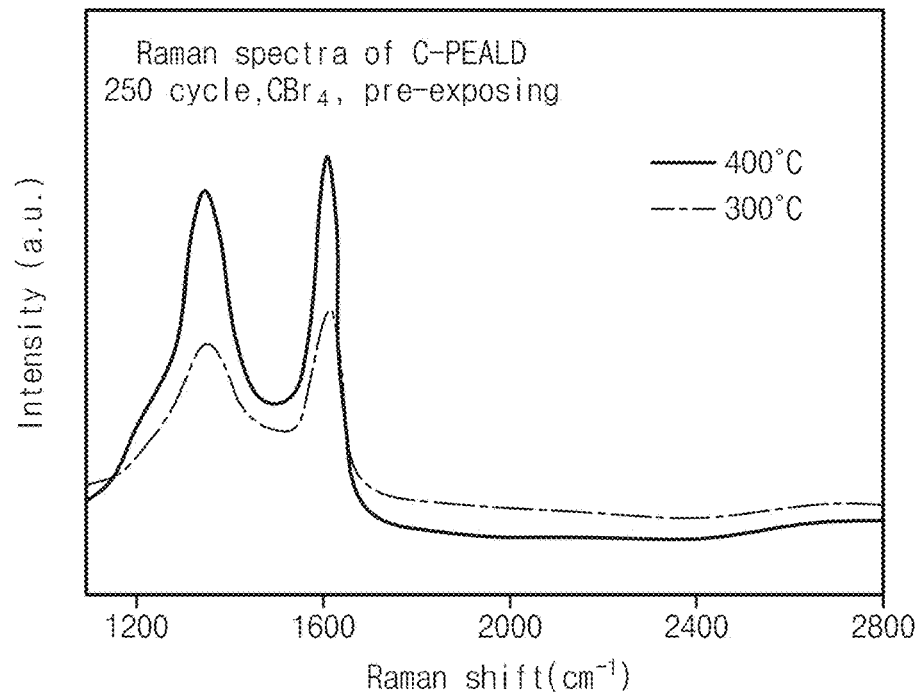
FIG. 9 is graph showing Raman spectra of a carbon thin-film device by deposition temperature of a carbon thin film according to embodiments of the inventive concept.

FIG. 9 is graph showing Raman spectra of a carbon thin-film device by deposition temperature of a carbon thin film according to embodiments of the inventive concept.

Referring to FIG. 9, it can be seen that both carbon thin films respectively according to Embodiment 1 (300° C.) and Embodiment 3 (400° C.) are well deposited in carbon thin-film devices. According to an embodiment of the inventive concept, it can be seen that low-temperature processes of 300° C. and 400° C. may form excellent carbon thin films on substrates.

Figure 15:
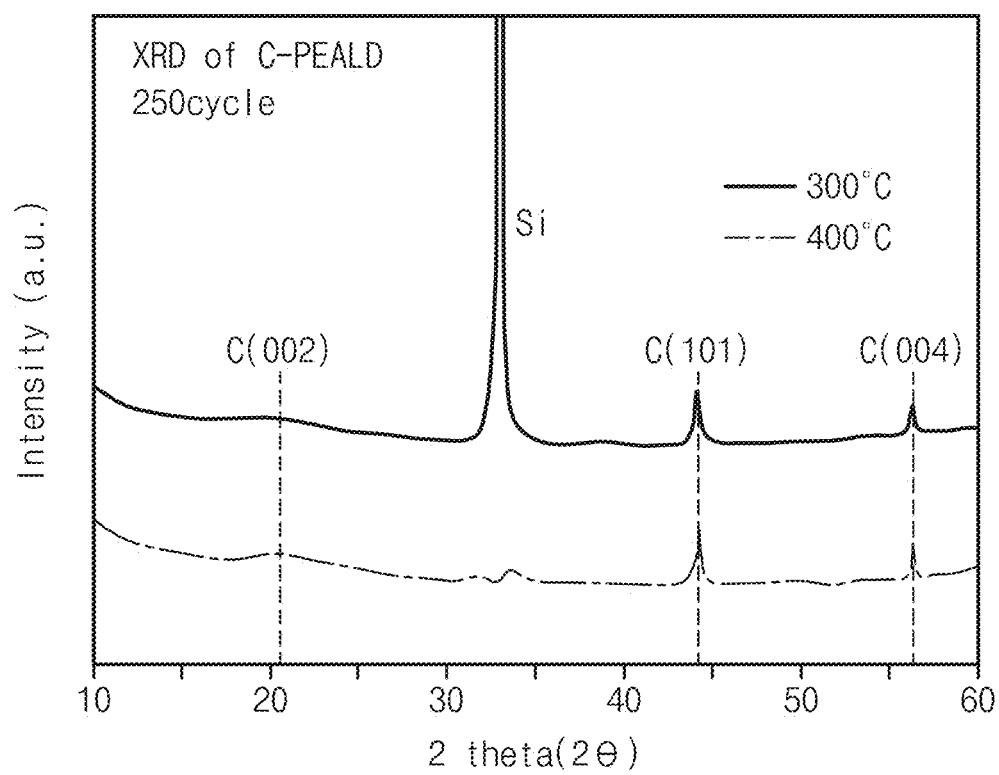
FIG. 15 is a graph showing results from X-ray diffraction analysis of carbon thin-film devices according to Embodiments 1 and 3 of the inventive concept.

FIG. 15 is a graph showing results from X-ray diffraction analysis of carbon thin-film devices according to Embodiments 1 and 3 of the inventive concept.

Referring to FIG. 15, it can be seen that both carbon thin-film devices according to Embodiments 1 and 3 have various phases of carbon.

Embodiment 4

This embodiment was performed as same as Embodiment 1, but formed a carbon thin film through 500 processing cycles, one processing cycle being composed of the carbon precursors supply, the purging, the hydrogen supply, and the purging.

Figure 10:
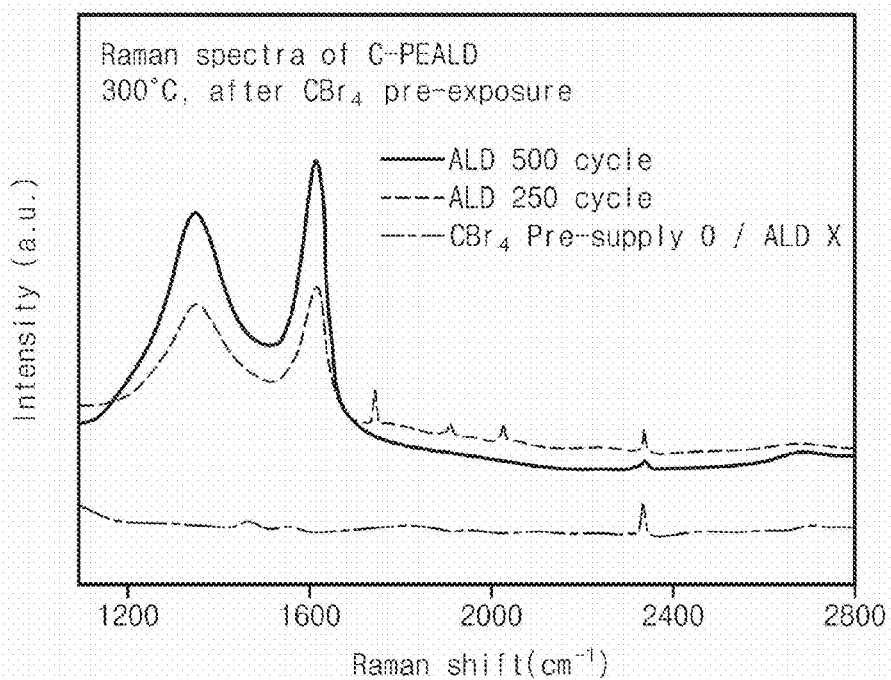
FIG. 10 is a graph showing Raman spectra of a carbon thin-film device by the number of processing cycles for carbon thin-film deposition according to embodiments of the inventive concept.

FIG. 10 is a graph showing Raman spectra of a carbon thin-film device by the number of processing cycles for carbon thin-film deposition according to embodiments of the inventive concept.

Referring to FIG. 10, it can be seen of deposition rates of carbon thin films of carbon thin-film devices according to Embodiments 1 and 4 different from the case without a step of depositing a carbon thin film through ALD, after a step of pre-supplying carbon tetrabromide ($CBr_4$), in the number of processing cycles for carbon thin-film deposition.

As shown in FIG. 10, in the case of the pre-supplying step, a carbon thin film is hardly deposited. According to Embodiment 1 (250 cycles) and Embodiment 4 (500 cycles), carbon thin films thereof is well deposited on substrates. Additionally, it can be seen that Embodiment 4 forming a carbon thin film through 500 cycles may provide a thicker carbon thin film, resulting in higher peak intensity, than Embodiment 1 forming a carbon thin film through 250 cycles.

Figure 11:
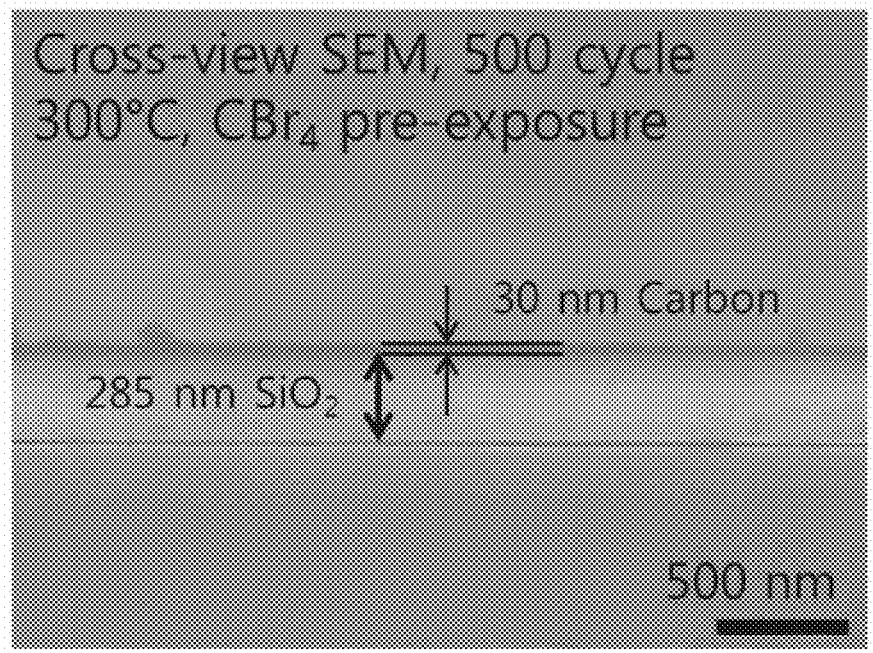
FIG. 11 shows an image taken by a Scanning Electron Microscope (SEM) from a section of a carbon thin-film device according to Embodiment 4 of the inventive concept.

FIG. 11 shows an image taken by a Scanning Electron Microscope (SEM) from a section of a carbon thin-film device according to Embodiment 4 of the inventive concept.

Referring to FIG. 11, it can be seen that a carbon thin-film device manufactured by Embodiment 4 of the inventive concept has a uniform carbon thin film about 30 nm on a silicon oxide substrate ($SiO_2$).

Embodiment 5-1

This embodiment was performed as same as Embodiment 1, but a substrate was prepared with the aspect ratio of 5:1 and with a plurality of nanoholes about 100 nm in diameter. Additionally, temperature was set at 400° C. in an ALD chamber when depositing a carbon thin film on the substrate having the plurality of nanoholes. One processing cycle of the carbon precursor's supply, the purging, the hydrogen supply, and the purging was repeated in 200 times to form a carbon thin film.

Embodiment 5-2

This embodiment was performed as same as Embodiment 5-1, but one processing cycle of the carbon precursors supply, the purging, the hydrogen supply, and the purging was repeated in 400 times to form a carbon thin film.

Embodiment 5-3

This embodiment was performed as same as Embodiment 5-1, but one processing cycle of the carbon precursors supply, the purging, the hydrogen supply, and the purging was repeated in 600 times to form a carbon thin film.

Figure 12A:
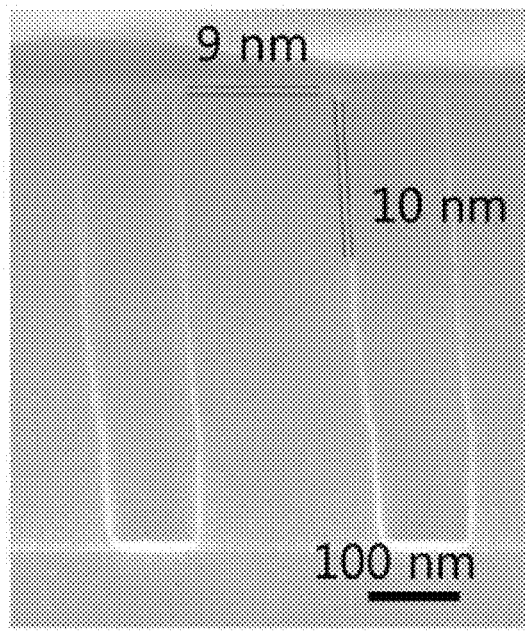
FIGS. 12A, 12B, and 12C show images taken by SEM from sections of carbon thin-film devices in which carbon thin films are formed on nanohole-structured substrates according to Embodiments 5-1, 5-2, and 5-3 of the inventive concept.
Figure 12B:
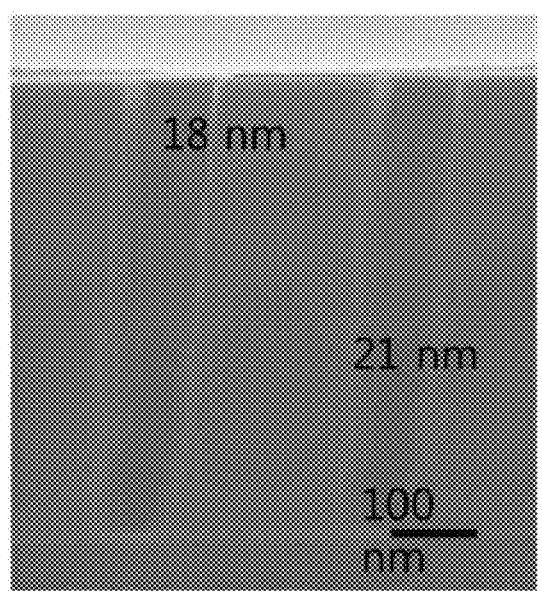
Figure 12C:
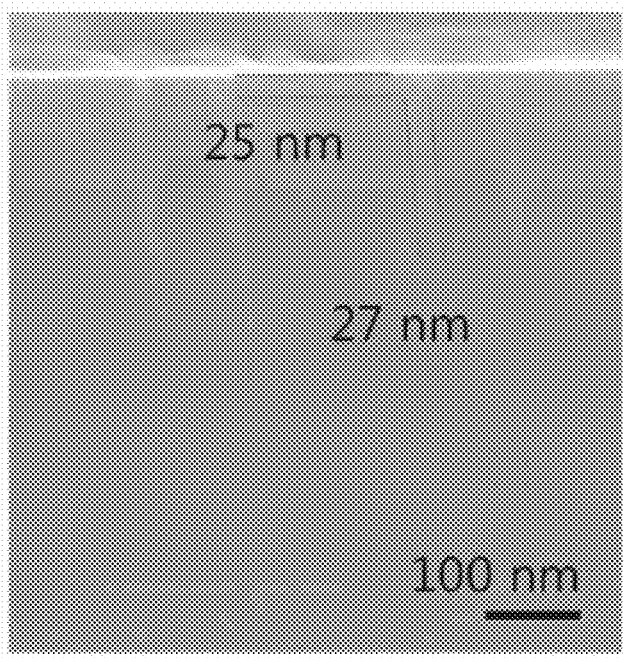

FIGS. 12A to 12C show images taken by SEM from sections of carbon thin-film devices in which carbon thin films are formed on nanohole-structured substrates according to Embodiments 5-1, 5-2, and 5-3 of the inventive concept.

As shown in FIGS. 12A to 12C, it can be seen that carbon thin films may be uniformly formed even on high-stepped nanohole structure.

Referring to FIG. 12A, in the case of forming a carbon thin film through 200 cycles according to Embodiment 5-1, it can be seen that the carbon thin film may be uniformly formed in a thickness of 9 nm to 10 nm on a nanostructured substrate.

Additionally, as shown in FIG. 12B, in the case of forming a carbon thin film through 400 cycles according to Embodiment 5-2, it can be seen that the carbon thin film may be uniformly formed in a thickness of 18 nm to 21 nm on a nanostructured substrate.

Additionally, as shown in FIG. 12C, in the case of forming a carbon thin film through 400 cycles according to Embodiment 5-3, it can be seen that the carbon thin film may be uniformly formed in a thickness of 25 nm to 27 nm on a nanostructured substrate.

Figure 13:
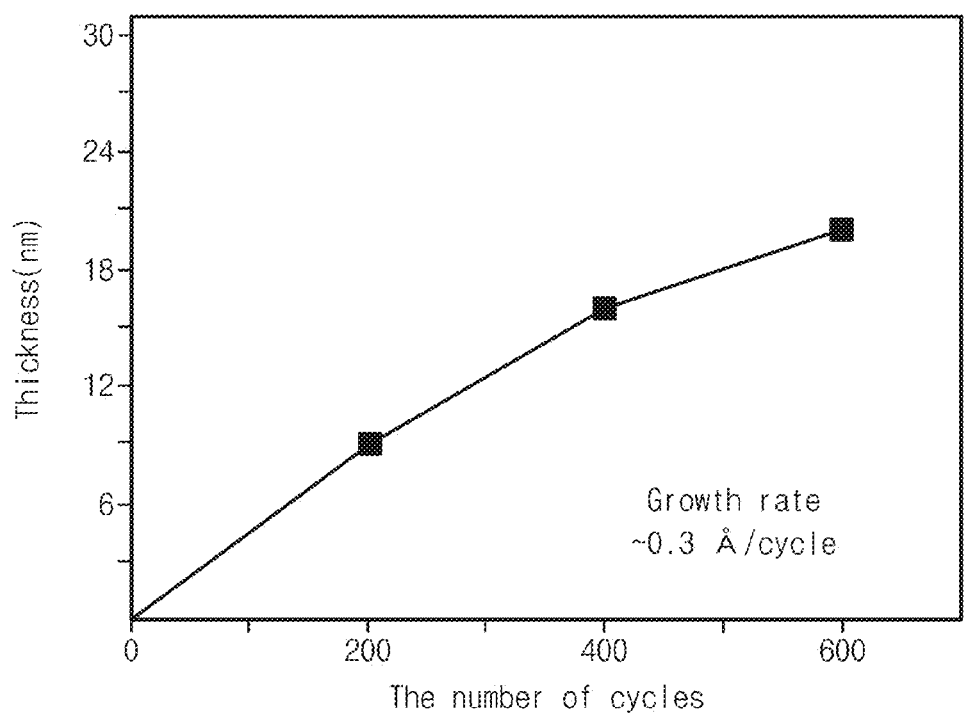
FIG. 13 is a graph showing a variation of thickness by the number of processing cycles for carbon thin-film deposition of a carbon thin-film device according to embodiments of the inventive concept.

FIG. 13 is a graph showing a variation of thickness by the number of processing cycles for carbon thin-film deposition of a carbon thin-film device according to embodiments of the inventive concept.

Referring to FIG. 13, it can be seen that as the number of processing cycles for carbon thin-film deposition increases, a carbon thin film may be formed thicker as much. For example, it can be seen that a carbon film is formed in a thickness about 0.3 nm.

Figure 14:
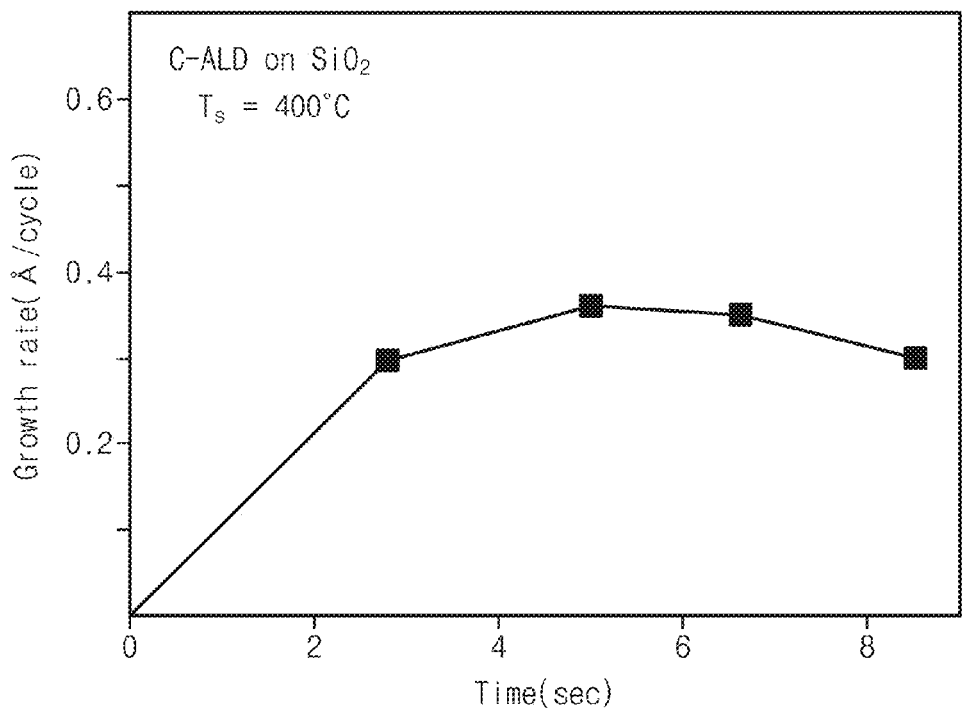
FIG. 14 is a graph showing growth rates of a carbon thin film along halocarbon supply time at a step S310 of supplying halocarbon as carbon precursors on a substrate in a method for manufacturing a carbon thin-film device according to embodiments of the inventive concept.

FIG. 14 is a graph showing growth rates of a carbon thin film along halocarbon supply time at the step S310 of supplying halocarbon as carbon precursors on a substrate in a method for manufacturing a carbon thin-film device according to embodiments of the inventive concept.

As shown in FIG. 14, it can be seen that in depositing a carbon thin film through ALD according to an embodiment of the inventive concept, the carbon thin film may be improved in growth rate when carbon tetrabromide as carbon precursors is supplied under partial pressure of 0.01 to 0.02 torr for 2 to 8 seconds. Otherwise, in the case of supplying carbon tetrabromide over 8 seconds, it can be seen that the carbon thin film may be degraded in growth rate with insignificant variation.

<Embodiment 6> Carbon Nanowire

This embodiment was performed as same as Embodiment 1, but prepared a nanowire having a thickness about 400 nm and a length about 10 μm where a silicon oxide ($SiO_2$) is formed on a silicon nanowire. After then, a carbon thin film was deposited on the nanowire through the same process with Embodiment 1.

Figure 16:
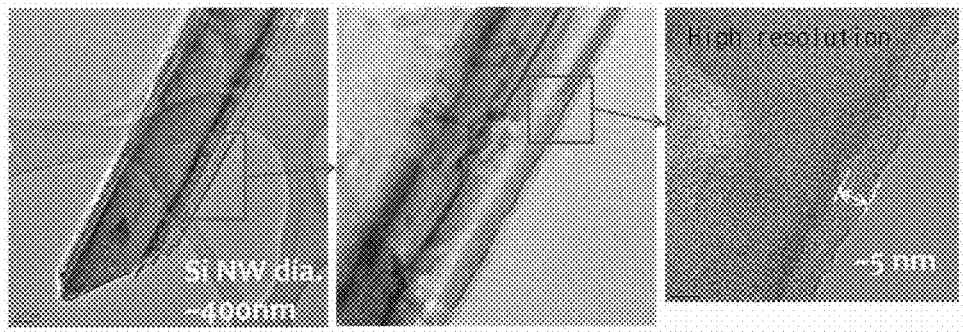
FIG. 16 shows an image taken by a Transmission Electron Microscope (TEM) from a carbon nanowire according to Embodiment 6 of the inventive concept.

FIG. 16 shows an image taken by a Transmission Electron Microscope (TEM) from a carbon nanowire according to Embodiment 6 of the inventive concept.

Referring to FIG. 16, it can be seen that a carbon layer about 5 nm may be formed on a silicon nanowire having a diameter about 400 nm.

Figure 17:
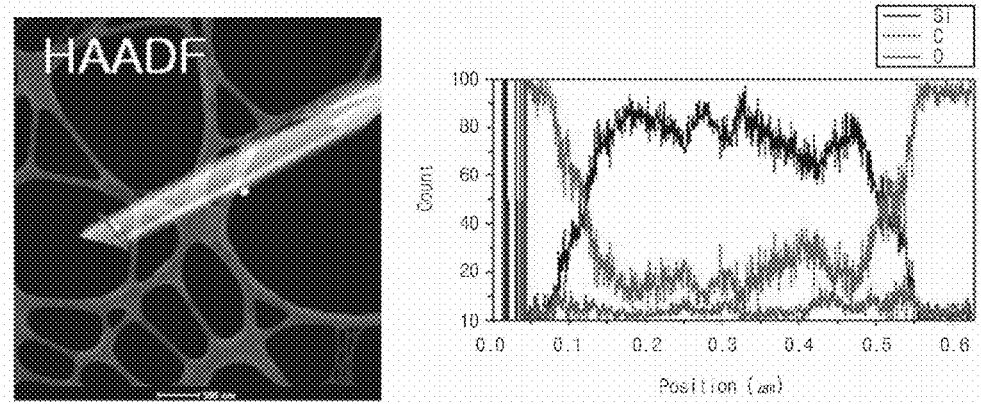
FIG. 17 is a graph showing a line scanning result of a carbon nanowire according to Embodiment 6 of the inventive concept.

FIG. 17 is a graph showing a line scanning result of a carbon nanowire according to Embodiment 6 of the inventive concept.

The right graph of FIG. 17 shows a line scanning result along the arrow in an image of the left taken by High-Angle Annular Dark Field (HAADF) electron microscope. Referring to the right graph of FIG. 17, it can be seen that a carbon nanowire according to Embodiment 6 may contain silicon, oxygen, and carbon atoms.

As described above, embodiments of the inventive concept provide a carbon thin-film device and a method for manufacturing the carbon thin-film device, capable of depositing a carbon thin film through ALD without limitation to a kind of substrate. According to embodiments of the inventive concept, it may be allowable to uniformly deposit a carbon thin film in a large area at low temperature and it may be also allowable to uniformly deposit a carbon thin film on a nanostructure with high steps such as nanoholes or on a three-dimensional structure such as nanowire.

According to an embodiment of the inventive concept, it may be allowable to uniformly deposit a carbon thin film through ALD without limitation to a kind of substrate.

According to another embodiment of the inventive concept, it may be allowable to uniformly deposit a carbon thin film on a three-dimensional structure through ALD.

Advantageous effects of the inventive concept may not be restrictive to the aforementioned and other effects not mentioned may be clearly comprehensible from the descriptive specification and the accompanied figures by those skilled in the art.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method of manufacturing a carbon thin-film device, the method comprising:
    forming a functional group on a surface of a substrate which does not have a metal layer on the surface to functionalize the surface of the substrate, the functional group comprising a hydroxyl group;
    pre-supplying carbon tetrabromide (CBr4) to the substrate, on which the hydroxyl group is formed; and
    depositing a carbon thin film through atomic layer deposition on the substrate, after the carbon tetrabromide is pre-supplied to the substrate,
    wherein the functionalizing of the substrate includes forming an adsorption layer, which includes the functional group, on the substrate, the adsorption layer being formed of a single atomic layer or a single molecular layer,
    wherein atoms of the adsorption layer are covalent-bonded with atoms of the substrate, and carbon atoms of a basal layer of the carbon thin film are covalent-bonded with the atoms of the adsorption layer,
    wherein the depositing of the carbon thin film on the substrate includes repeating unit cycles a number of times,
    wherein the unit cycle includes
        supplying halocarbon as carbon precursors to the substrate after the carbon tetrabromide is pre-supplied on the substrate;
        supplying a purge gas to the substrate to purge the substrate;
        supplying a reaction gas to the substrate; and
        supplying the purge gas to the substrate to purge the substrate.

2. The method of claim 1, wherein the functionalizing of the substrate comprises:
    supplying a solution, which is made by mixing sulfuric acid and hydrogen peroxide water, to the substrate to form a hydroxyl group on the substrate.

3. The method of claim 1, wherein the reaction gas has larger bonding energy to halogen atoms of the halocarbon than to carbon atoms of the halocarbon.

4. The method of claim 1, wherein the the reaction gas is hydrogen gas or hydrogen plasma.

5. The method of claim 1, wherein the pre-supplying of the carbon tetrabromide comprises:
    supplying the carbon tetrabromide to the substrate, on which the hydroxyl group is formed, for 30 seconds to 5 minutes.

6. The method of claim 1, wherein the carbon thin film is formed at deposition temperature of 200 to 450° C.

* * * * *